United States Patent
Lustig et al.

(10) Patent No.: US 7,132,828 B2
(45) Date of Patent: Nov. 7, 2006

(54) ARTIFACT REDUCTION IN SSFP MRI USING SUPER FIELD VIEW RECONSTRUCTION

(75) Inventors: Michael Lustig, Stanford, CA (US); John M. Pauly, Redwood City, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 0 days.

(21) Appl. No.: 11/179,281

(22) Filed: Jul. 11, 2005

(65) Prior Publication Data

US 2006/0214660 A1     Sep. 28, 2006

Related U.S. Application Data

(60) Provisional application No. 60/665,984, filed on Mar. 28, 2005.

(51) Int. Cl.
*G01V 3/00*     (2006.01)

(52) U.S. Cl. ........................ 324/309; 324/307

(58) Field of Classification Search ............... 324/309, 324/307, 300
See application file for complete search history.

(56) References Cited

U.S. PATENT DOCUMENTS

| | | | |
|---|---|---|---|
| 6,307,368 B1 | 10/2001 | Vasanawala et al. | |
| 6,452,387 B1 * | 9/2002 | Hargreaves et al. | ........ 324/300 |
| 6,624,630 B1 | 9/2003 | Foxall | |
| 6,819,104 B1 | 11/2004 | Yamazaki et al. | |
| 6,885,193 B1 * | 4/2005 | Foxall | ........................ 324/309 |
| 6,906,516 B1 * | 6/2005 | Bangerter et al. | .......... 324/309 |

OTHER PUBLICATIONS

Bangerter et al., "*Analysis of Multiple-Acquisition SSFP*," Magnetic Resonance in Medicine, vol. 51, pp. 1038-1047, 2004.
Elad et al., "*Restoration of a Single Superresolution Image from Several Blurred, Noisy and Undersampled Measured Images*," IEEE Transactions on Image Processing, vol. 6, No. 12, Dec. 1999, pp. 1646-1658.
Foxall, "*Frequency-Modulated Steady-State Free Precession Imaging*," Magnetic Resonance in Medicine, vol. 48, pp. 502-508, 2002.
Fessler, "*Nonuniform Fast Fourier Transforms Using Min-Max Interpolation*," IEEE Transactions on Signal Processing, vol. 51, No. 2, Feb. 2003, pp. 560-574.
McGibney et al., "*Quantitative Evaluation of Several Partial Fourier Reconstruction Algorithms Used in MRI*," MRM, vol. 30, pp. 51-59, 1993.
Pruessmann et al., "*Advances in Sensitivity Encoding with Arbitrary k-space Trajectories*," Magnetic Resonance in Medicine, vol. 46, pp. 638-651, 2001.
Zur et al., "*An Analysis of Fast Imaging Sequences with Steady-State Transverse Magnetization Refocusing*," Magnetic Resonance in Medicine, vol. 6, pp. 175-193, 1988.

* cited by examiner

*Primary Examiner*—Louis M. Arana
(74) *Attorney, Agent, or Firm*—Beyer Weaver & Thomas LLP

(57) ABSTRACT

Banding artifacts in steady state free precession (SSFP) magnetic resonance imaging (MRI) are reduced by acquiring and combining multiple SSFP images in an augmented matrix where an acquisition vector in k-space is equal to a Fourier matrix of the trajectory on a known distortion operator for each trajectory in k-space.

15 Claims, 6 Drawing Sheets

ARTIFACT REDUCTION IN SSFP MRI USING SUPER FIELD VIEW RECONSTRUCTION

CROSS REFERENCE TO RELATED APPLICATIONS

This application claims priority under 35 U.S.C. §119 from U.S. Provisional Patent Application No. 60/665,984, filed Mar. 28, 2005, entitled "A METHOD FOR RAPID SSFP BANDING ARTIFACT REDUCTION", by Lustig et al; which is incorporated herein by reference for all purposes.

GOVERNMENT RIGHTS

The U.S. government has rights in the disclosed invention pursuant to NIH grants to Stanford University including NIH-R01HL067161, NIH-R01EB02929, and NIH-P41 RR09784.

BACKGROUND OF THE INVENTION

This invention relates generally to magnetic resonance imaging (MRI), and more particularly the invention relates to MRI using steady state free precession (SSFP) with banding artifact reduction.

Magnetic resonance imaging (MRI) is a non-destructive method for the analysis of materials and represents a new approach to medical imaging. It is generally non-invasive and does not involve ionizing radiation. In very general terms, nuclear magnetic moments are excited at specific spin precession frequencies which are proportional to the local magnetic field. The radio-frequency signals resulting from the precession of these spins are received using pickup coils. By manipulating the magnetic fields, an array of signals is provided representing different regions of the volume. These are combined to produce a volumetric image of the nuclear spin density of the body.

Magnetic resonance (MR) imaging is based on nuclear spins, which can be viewed as vectors in a three-dimensional space. During a MR experiment, each nuclear spin responds to four different effects—precession about the main magnetic field, nutation about an axis perpendicular to the main field, and both transverse and longitudinal relaxation. In steady-state MR experiments, a combination of these effects occurs periodically.

Refocused steady-state free precession (SSFP) sequences have recently gained popularity in magnetic resonance imaging, due to improved gradient hardware. SSFP imaging provides high signal and good contrast in short scan times. However, in regions of high local magnetic field variations, SSFP images often suffer from characteristic bands of signal loss, or "banding artifact".

Several multiple acquisition methods to reduce the banding artifact have been described in the prior art. In these schemes, multiple sets of images are acquired each with a different RF phase increment from one sequence repetition to the next (RF phase cycling). The images are combined in a way to effectively reduce the dark band artifact. However, the extra cost in scan time (usually up to a factor of 4) is limiting.

SUMMARY OF THE INVENTION

In accordance with the invention, banding artifacts in SSFP imaging are reduced while magnetic resonance scan time is also reduced.

In accordance with the invention, multiple acquisition SSFP is posed as a generalization of sensitivity encoding (SENSE, see Pruessmann et al., "Advances in Sensitivity Encoding with Arbitrary k-Space Trajectories", MRM2001; 46:638–651), or as a super Field of View (sFOV) image reconstruction. In sFOV imaging, a set of distorted aliased small sFOV representations of a larger FOV object are obtained, and a full FOV undistorted object is obtained from k-space data using an acquisition vector and an encoding matrix based on a known distortion operator and the Fourier matrix of the specific k-space trajectory.

More specifically, a steady state is established at one resonant frequency with a specific banding pattern. A first subset of a full data set is acquired, and then a steady state is established at a different resonant frequency and banding pattern, and again a second subset of a full data set is acquired. These steps are repeated until a full data set is acquired. A spatial banding pattern is estimated for each frequency, and then the image is reconstructed using the estimated spatial banding patterns.

Using the invention, banding artifacts in SSFP imaging are reduced while magnetic resonance scan time is also reduced.

The invention and objects and features thereof will be more readily apparent from the following detailed description and appended claims when taken with the drawings.

DETAILED DESCRIPTION OF THE PREFERRED EMBODIMENTS

Figure 1A:
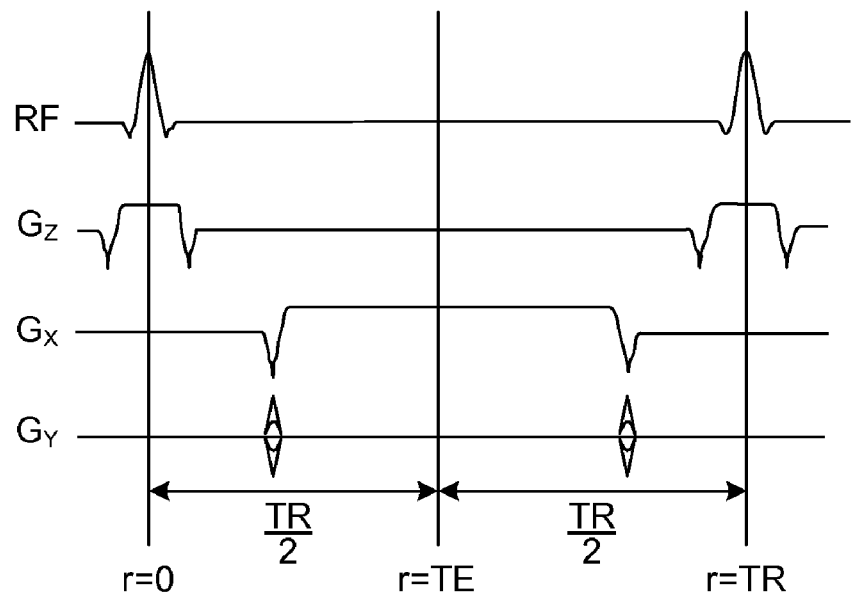
FIGS. 1A, 1B illustrate a SSFP phase sequence in accordance with prior art.
Figure 1B:
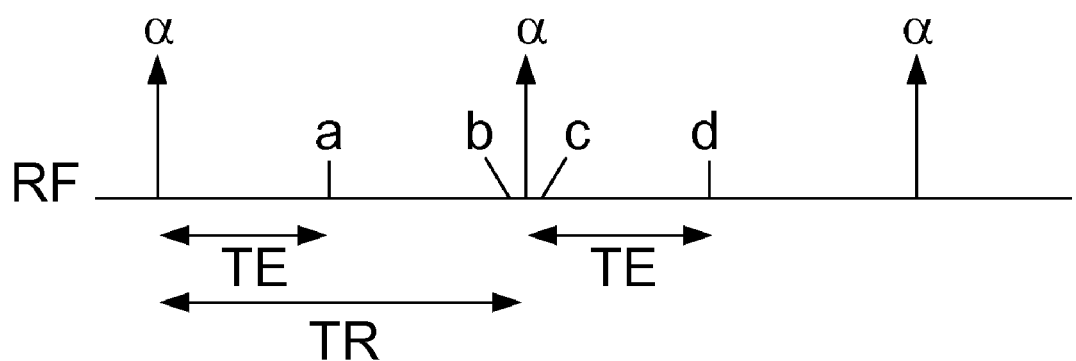

As illustrated in FIGS. 1A, 1B, a refocused SSFP sequence includes a single RF excitation which is repeated periodically. All gradients used for slice selection or imaging are fully rewound over each repetitive time, TR. In the steady-state, the magnetization at points a and d is the same.

Magnetization is tipped about a traverse axis through an angle α. Between excitations, the magnetization undergoes a precession by an angle $\theta=2\Delta fTR$ about the z-axis (direction of B0), where $\Delta f$ is the tissue off-resonance, and also experiences both T1 and T2 relaxation.

During the sequence each spin is affected by RF pulses, relaxation and free precession. The steady-state magnetization for SSFP is a function of the sequence parameters flip angle (a), repetition time (TR) and echo time (TE) as well as the tissue parameters T1, T2, and resonant frequency shift $\Delta f$.

Figure 2:
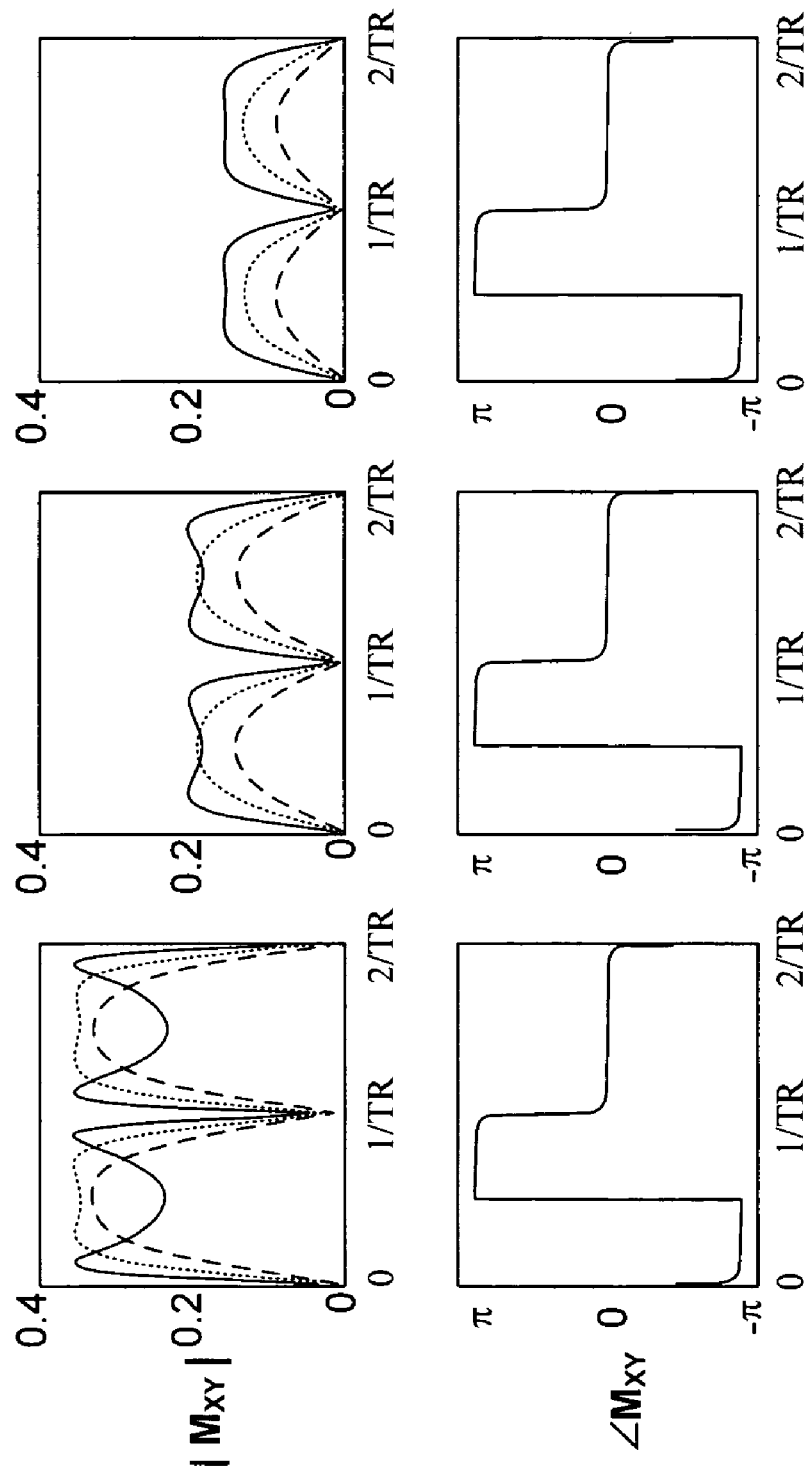
FIG. 2 illustrates SSFP transverse magnetization and phase as a function of off-resonance frequency for a SSFP profile.

Signal readout is performed each period, and low spatial frequency information can be acquired at an echo time TE typically spaced midway between the RF excitation pulses. The resultant steady-state MR signal is a strong function of the local resonant frequency, as shown in FIG. 2, which shows magnetization or signal profiles (i.e., off-resonance spectra). SSFP transverse magnetization magnitude (top)

and phase (bottom) are shown as a function of off-resonant frequency. Each graph shows three different tip angles: the solid line corresponds to a 30° tip angle, the dotted line 60°, and the dashed line 90°. Profiles are shown for three different T1/T2 combinations: T1/T2=200/100 ms (left), T1/T2=600/100 ms (middle), and T1/T2=1000/100 ms (right). TE=TR/2 in all cases. The periodic nulls in the signal profile, separated by a frequency of 1/TR, are the source of off-resonance banding artifacts. If the phase φ of the RF excitation pulse is incremented by a constant value Δφ from excitation to excitation ("phase cycling"), the magnetization profile is shifted in off-resonance frequency by Δφ/(2π·TR).

In accordance with the invention, the multiple acquisition SSFP imaging process is treated as a sFOV reconstruction to produce an image with reduced or no banding artifact without the time penalty of multiple acquisition SSFP.

In an sFOV setting one measures a set of distorted, aliased small FOV representations of a larger FOV object. The distortion for each image is different, known and linear. For example, a distortion can be due to motion, blur, sensitivity mask or geometric distortion. The k-space trajectory is arbitrary and can be different for each of the images. This is a generalization of SENSE, where the distortion is due to the sensitivity of the receiver coil and the k-space trajectory is the same for all the coil images. The k-space data $y_i$ for each image version can be written as, $$y_i = F_i S_i m \quad (1)$$

where m is the full FOV undistorted object, $S_i$ is the known distortion operator of the $i^{th}$ image and $F_i$ is the Fourier matrix of the specific k-space trajectory. We can write this in an augmented matrix as, $$Y = Em \quad (2)$$

where $Y=[y_1^T, \ldots, y_n^T]^T$ is the acquisition vector and $E=[(F_1 S_1)^T, \ldots, (F_n s_{nj})^T]^T$ is an encoding matrix. This is a linear set of equations and can be solved for m in many ways. See Pruessmann et al., "Advances in Sensitivity Encoding with Arbitrary k-Space Trajectories", MRM2001; 46:638–651, supra, for example. We can now formulate the multiple acquisitions SSFP as an sFOV problem. The SSFP signal exhibits a high sensitivity of both magnitude and phase to off-resonance frequency. By changing the RF phase cycling the response is shifted in frequency. This can be thought of as different distortions that operate on the object. Since in general, off-resonance is slowly varying, the SSFP sensitivity ($S_i$) can be measured from low-resolution information with little or no overhead. Alternatively, the sensitivity maps can be estimated from frequency maps and the SSFP signal sensitivity to off resonance frequency (FIG. 2). Therefore, instead of acquiring multiple full k-space images we can sub-sample k-space and acquire aliased small FOV image versions with different RF phase increments. We then use Eq. 2 and unfold the aliasing using the measured low-resolution sensitivity information (Si). This approach is general and can, in principle, be used in Cartesian, radial or spiral trajectories (FIGS. 3A–3C).

Figure 3A:
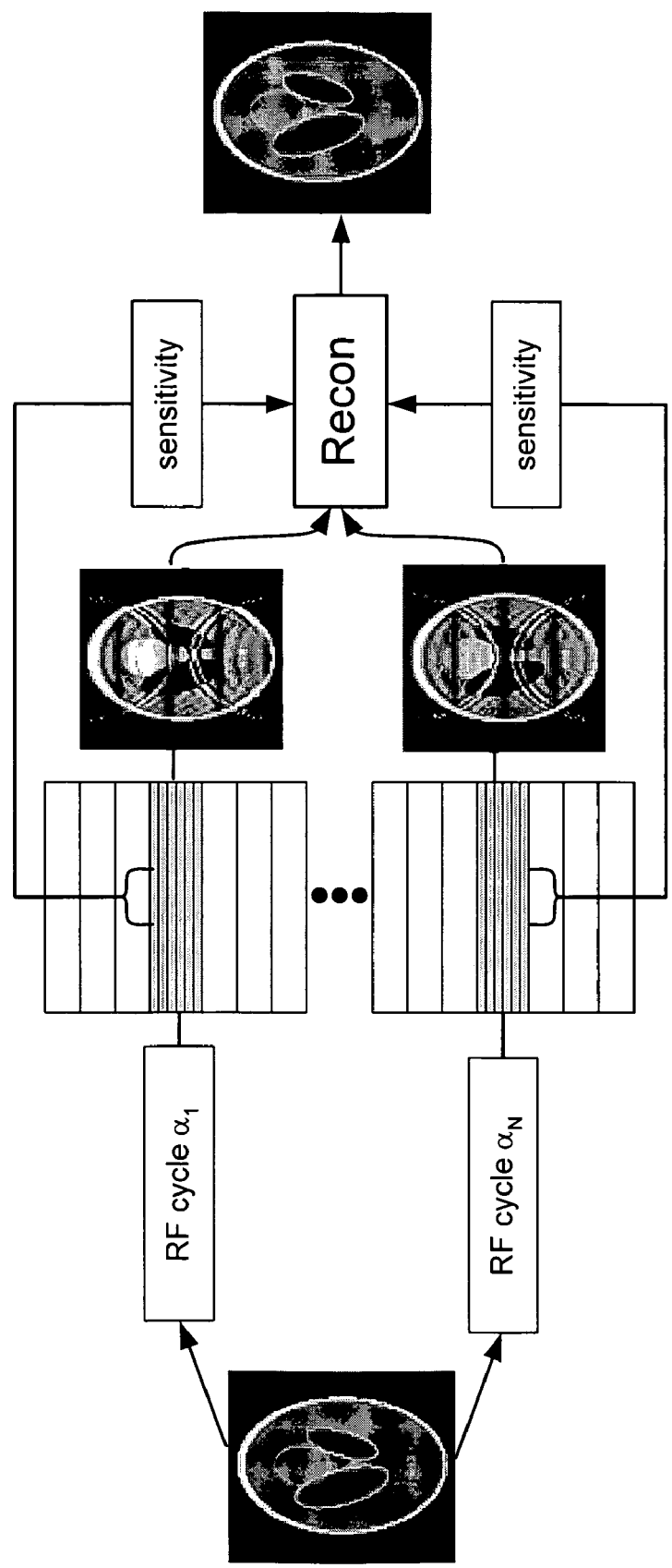
FIGS. 3A–3C are outlines of the imaging and reconstruction processes for 2D and 3D Cartesian, radial, and spiral acquisitions, respectively.

FIG. 3A is an outline of the imaging and reconstruction process for 2D and 3D Cartesian acquisition. N separate under sampled k-space images are acquired, each with a different RF phase increment. The k-space lines for each image are chosen in such a way that a full-FOV low resolution image can be reconstructed. The images from each RF phase increment acquisition suffer from aliasing artifacts as well as banding artifact. Sensitivity maps are calculated from the low resolution information. A banding free, aliasing free image is reconstructed from the k-space and the sensitivity maps using Eq. 2.

Figure 3B:
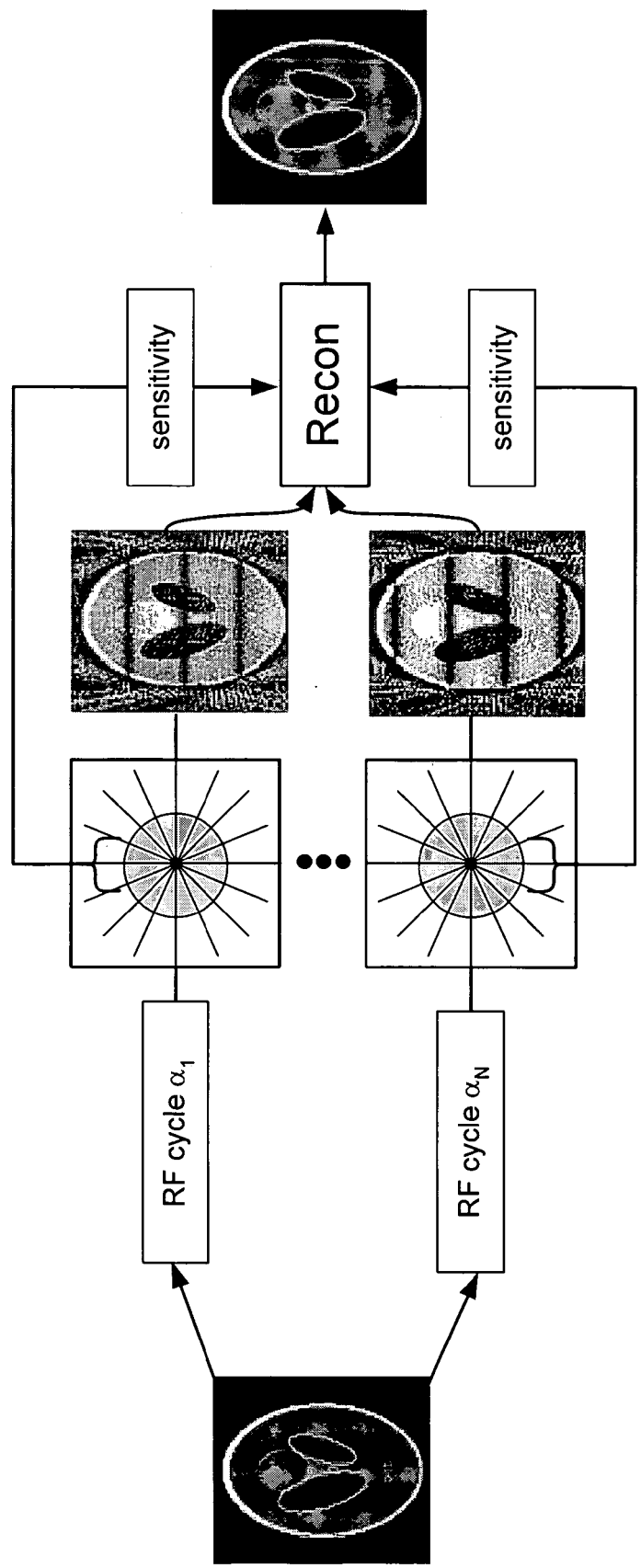

FIG. 3B is an outline of the imaging and reconstruction process for 2D and 3D radial acquisition. N separate under sampled k-space images are acquired, each with a different RF phase increment. In radial imaging the center of k-space is over-sampled and a full-FOV low resolution image can be reconstructed. The images from each RF phase increment acquisition suffer from aliasing artifacts as well as banding artifact. Sensitivity maps are calculated from the low resolution information. A banding free, aliasing free image is reconstructed from the k-space and the sensitivity maps using Eq. 2.

Figure 3C:
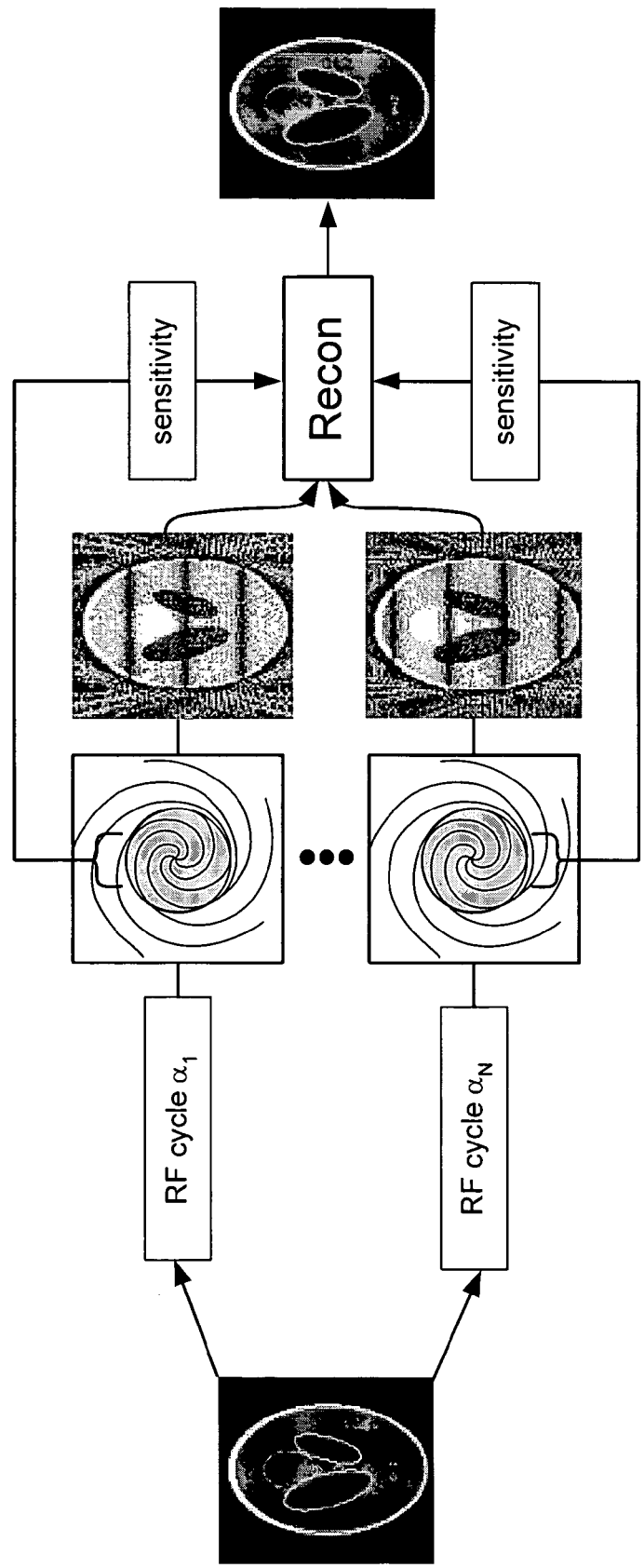

FIG. 3C is an outline of the imaging and reconstruction process for a spiral acquisition. N separate under sampled k-space images are acquired, each with a different RF phase increment. In variable density spiral imaging the center of k-space is over-sampled and a full-FOV low resolution image can be reconstructed. The images from each RF phase increment acquisition suffer from aliasing artifacts as well as banding artifact. Sensitivity maps are calculated from the low resolution information. A banding free, aliasing free image is reconstructed from the k-space and the sensitivity maps using Eq. 2.

When acquiring several images at different RF phase increments, there is a small penalty in the time it takes the system to get into the steady state. An extension of our method with frequency modulated SSFP can be used to eliminate the transitional state time.

Figure 4:
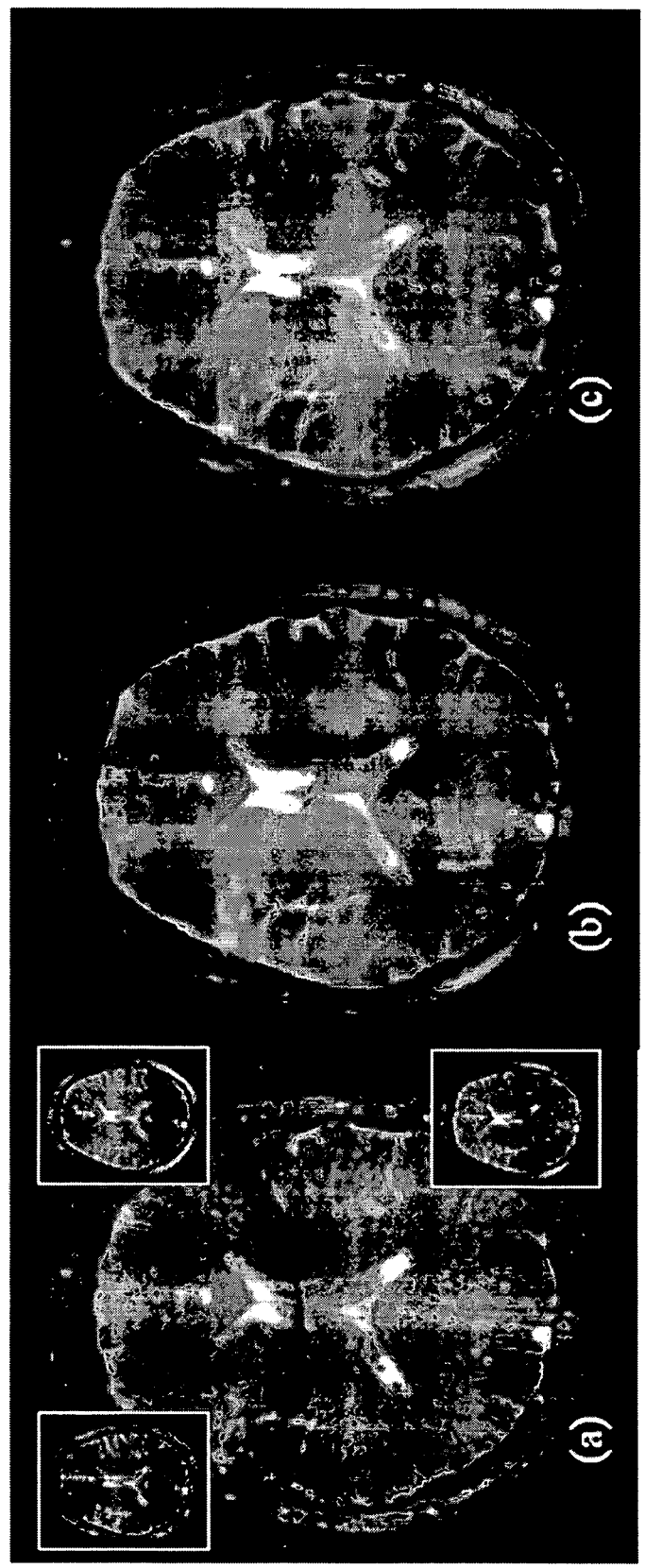
FIG. 4 illustrates a comparison of the sFOV method with the conventional full k-space multiple acquisition SSFP for radial imaging.

FIG. 4 shows the result of an in-vivo radial acquisition experiment and a comparison of the sFOV method with the conventional full k-space multiple acquisition SSFP for radial imaging. Both the sFOV and multiple acquisition methods exhibit similar quality. However, the sFOV method requires 25% of the scan time for the full k-space multiple acquisition method. a) Undersampled images with different RF phase increments. b) sFOV reconstruction. c) Multiple acquisition sum of squares SSFP. The experiment was conducted on a 1.5T GE Signa scanner with gradients capable of 40 mT/m and 150 mT/m/ms maximum slew-rate. Four images with corresponding 0, 90, 180 and 270 RF phase increments of an axial slice through the head (FOV=24 cm, res=1 mm) were acquired using a 2D radial balanced SSFP sequence (TR=8.32 ms, TE=1.3 ms, α=30). Each image was obtained by collecting 133 spokes with a 3 ms readout, which is 25% of the actual FOV (full FOV corresponds to 532 spokes). The inherent over sampling of the k-space origin was used for sensitivity estimation. The image was reconstructed using iterative conjugate-gradient method with min-max nuFFT. See Fessler et al. "Nonuniform Fast Fourier Transforms Using Min-Max Interpolation", IEEE Trans on Sig Proc, 2003; 51:560–574. The result was compared to a full FOV multiple acquisition sum-of-squares. It is important to note that since we acquire several different images one after the other, the k-space trajectory is different for each of the images. For example, in the radial case the first image will have the 1st, 5th, 9th . . . spokes, the second image will have the 2nd, 6th, 10th, . . . spokes etc. Because of this, the encoding matrix is well conditioned and the reconstruction does not suffer a significant loss in SNR as can happen in SENSE imaging.

While the invention has been described with reference to specific embodiments, the description is illustrative of the invention and is not to be construed as limiting the invention. Various modifications and applications may occur to those skilled in the art without departing from the true spirit and scope of the invention as defined by the appended claims.

What is claimed is:

1. In magnetic resonance imaging using steady state free precession (SSFP), a method of reducing banding artifacts comprising the steps:
   a) establishing a steady state at one resonant frequency, with a specific spatial banding pattern,
   b) acquiring a first subset of a full spatial frequency data set,
   c) changing to a steady state having a different resonant frequency and banding pattern,
   d) acquiring a second subset of the full spatial frequency data set,
   e) repeating steps c) and d) until a full data set is collected,
   f) estimating a spatial banding pattern for each frequency, and
   g) reconstructing an image using the estimated spatial banding patterns, and the known spatial frequency encoding of the acquired data using an inversion of the matrix equation $$Y = Em$$

where
   Y is the vector of the acquired data, $Y = [y_1^T, \ldots, y_n^T]^T$,
   E is the encoding matrix, $E = [(F_1 S_1)^T, \ldots, (F_m S_n)^T]^T$
   m is the object being imaged
   $S_i$ is a known distortion operator of the i th image,
   $F_i$ is the Fourier matrix of a specific k-space trajectory.

2. The method of claim 1, where the spatial banding patterns are estimated from low resolution images.

3. The method of claim 1, where the spatial banding patterns are estimated from low resolution field map information.

4. The method of claim 1, where the spatial frequency data subsets b) and d) are small field-of-view aliased images.

5. The method of claim 1, where the spatial frequency data subsets b) and d) are obtained in a single acquisition while the banding pattern is continuously changed by modulating the frequency.

6. The method of claim 1, where the full spatial frequency data set is acquired using a radial trajectory in spatial frequency space.

7. The method of claim 1, where the full spatial frequency data set is acquired using a Cartesian trajectory in spatial frequency space.

8. The method of claim 1, where the full spatial frequency data set is acquired using a Spiral trajectory in spatial frequency space.

9. The method of claim 1 wherein step a) employs Cartesian 2 Dimensional acquisition.

10. The method of claim 1 wherein step a) employs Cartesian 3 Dimensional acquisition.

11. The method of claim 1 wherein step a) employs radial 2 Dimensional acquisition.

12. The method of claim 1 wherein step a) employs radial 3 Dimensional acquisition.

13. The method of claim 1 wherein step a) employs spiral 2 Dimensional acquisition.

14. The method of claim 1 wherein step a) employs spiral 3 Dimensional acquisition.

15. The method of claim 1 where frequency modulated SSFP sequences are employed for vector acquisition.

* * * * *